US012648472B2

(12) United States Patent
Yu et al.

(10) Patent No.: US 12,648,472 B2
(45) Date of Patent: Jun. 2, 2026

(54) SEMICONDUCTOR BONDING TOOL AND METHOD OF OPERATING THE SAME

(71) Applicant: Taiwan Semiconductor Manufacturing Company, Ltd., Hsinchu (TW)

(72) Inventors: Tzu-Wei Yu, Hsinchu (TW); Ching-Hung Wang, Hsinchu (TW); Yeong-Jyh Lin, Caotun Township (TW); Ching I Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 960 days.

(21) Appl. No.: 17/664,162

(22) Filed: May 19, 2022

(65) Prior Publication Data

US 2023/0378125 A1     Nov. 23, 2023

(51) Int. Cl.
*H10W 72/00* (2026.01)
*H10P 72/78* (2026.01)
*H10W 80/00* (2026.01)

(52) U.S. Cl.
CPC ......... *H10W 72/0198* (2026.01); *H10P 72/78* (2026.01); *H10W 80/312* (2026.01); *H10W 80/327* (2026.01)

(58) Field of Classification Search
CPC ........... H10W 72/0198; H10W 80/312; H10W 80/327; H10P 72/78; H10P 72/0428; H01L 24/80
See application file for complete search history.

(56) References Cited

U.S. PATENT DOCUMENTS

| | | | | |
|---|---|---|---|---|
| 5,494,546 A | * | 2/1996 | Horvath | B29C 51/262 |
| | | | | 156/212 |
| 6,024,828 A | * | 2/2000 | Hwang | H01L 21/68721 |
| | | | | 156/345.52 |
| 8,087,708 B2 | * | 1/2012 | Thallner | H01L 21/6838 |
| | | | | 294/212 |
| 8,562,772 B2 | * | 10/2013 | Biteau | G02B 5/3033 |
| | | | | 264/1.1 |
| 9,463,599 B2 | * | 10/2016 | Helfrich | B29C 35/12 |
| 9,627,243 B2 | * | 4/2017 | Liu | H01L 21/6838 |
| 2004/0161882 A1 | * | 8/2004 | Teshirogi | B32B 37/003 |
| | | | | 438/151 |
| 2008/0279659 A1 | * | 11/2008 | Kobayashi | H01L 21/67132 |
| | | | | 414/800 |
| 2009/0186560 A1 | * | 7/2009 | Kordic | B24B 37/30 |
| | | | | 451/36 |
| 2020/0194401 A1 | * | 6/2020 | Ma | H01L 24/75 |

* cited by examiner

*Primary Examiner* — Su C Kim
(74) *Attorney, Agent, or Firm* — Harrity & Harrity, LLP

(57) ABSTRACT

A bag is filled with liquid, instead of an airbag filled with gas, to deform a bottom wafer toward a top wafer during a wafer bonding process. As a result, the liquid is less susceptible to temperature changes, which reduces run-out variation across wafer bonding processes. Reducing run-out variation conserves wasted wafers by increasing yield and reducing a quantity of non-functioning devices that are produced. Additionally, in some implementations, the liquid may be pre-heated before the bag is filled with the liquid. As a result, the bottom wafer (and, to some extent, the top wafer) experiences some thermal deformation and less mechanical deformation, which further increases yield and reduces a quantity of non-functioning devices that are produced.

20 Claims, 15 Drawing Sheets

200 —▸

250

252

254

256

300

108

102b

104b

202

102a

104a

570

202

104a

102a

572a

572b

800

810　Generate a vacuum between a bag and a first wafer to adhere the first wafer to the metal bag 820　Apply force to a second wafer to deform the second wafer toward the first wafer 830　Fill the metal bag with liquid to deform the first wafer toward the second wafer

SEMICONDUCTOR BONDING TOOL AND METHOD OF OPERATING THE SAME

BACKGROUND

Three-dimensional integrated circuits (3DICs) are a recent development in semiconductor packaging in which multiple semiconductor dies are stacked upon one another (e.g., using package-on-package (PoP) and system-in-package (SiP) packaging techniques). 3DICs provide improved integration density and other advantages, such as faster speeds and higher bandwidth, because of decreased length of interconnects between the stacked dies. Some methods of forming 3DICs involve bonding together two semiconductor wafers. For example, the wafers may be bonded together using fusion bonding, eutectic bonding, and hybrid bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
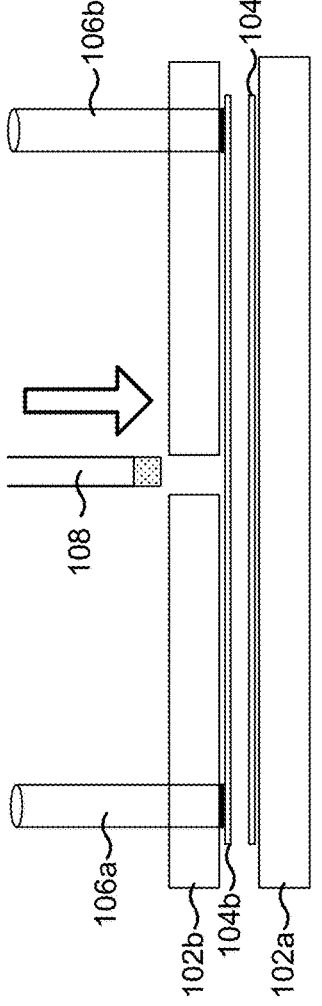
FIG. 1 is a diagram of an example top chuck for a wafer bonding tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When bonding two wafers together, a top wafer may be deformed by a pin while a bottom wafer is deformed by an inflatable airbag. A difference between a center of the top wafer and a center of the bottom wafer after bonding (and/or between an edge of the top wafer and an edge of the bottom wafer after bonding) is referred to as misalignment or "run-out." Gases are particularly susceptible to temperature changes. Accordingly, the run-out for wafers varies across processes, which results in overlay inaccuracies and wasted devices that do not function well. For example, run-out errors may have a range of 0.8 parts per million (ppm) or greater for batches of wafers bonded by an airbag. For example, complementary metal—oxide-semiconductor (CMOS) image sensors (CIS) and other electronic devices with smaller critical dimensions (CDs) are particularly susceptible to errors caused by run-out variation.

Some implementations described herein provide techniques and apparatuses for using a bag, filled with liquid such as water or oil, in place of an airbag to deform, support, and buffer a bottom wafer toward a top wafer during a wafer bonding process. For example, the bag may be formed of metal and filled with liquid to deform, support, and buffer the bottom wafer. As a result, the liquid is less susceptible to temperature changes, which reduces run-out variation across wafer bonding processes. Reducing run-out variation conserves wasted wafers by increasing yield and reducing a quantity of non-functioning devices (e.g., devices that fail a wafer acceptable test (WAT)) that are produced. In some implementations, the liquid may be pre-heated before the bag is filled with the liquid. As a result, the bottom wafer (and, to some extent, the top wafer) experiences some thermal deformation and less mechanical deformation, which further increases yield and reduces a quantity of non-functioning devices that are produced.

FIG. 1 is a diagram of an example top chuck for a wafer bonding tool 100 described herein. In particular, FIG. 1 illustrates a top chuck for deforming a top wafer toward a bottom wafer.

As shown in FIG. 1, the wafer bonding tool 100 includes a first chuck 102a, which may be mounted on a first stage, and a second chuck 102b, which may be mounted on a second stage. This first chuck 102a and the second chuck 102b may each include a ceramic or another hard material (e.g., with a hardness of at least approximately 10 gigapascals (GPa)). Additionally, the first chuck 102a and the second chuck 102b may each include a ceramic or another insulating materials (e.g., with a thermal conductivity of no more than approximately 180 Watts per meter-Kelvin (W/mK)).

In some implementations, the first chuck 102a and the second chuck 102b are substantially transparent. For example, the first chuck 102a and the second chuck 102b may each comprise glass, quartz, or another type of transparent material. Alternatively, the first chuck 102a and the second chuck 102*b* may each comprise a translucent or opaque material. Alternatively, the first chuck 102*a* is substantially transparent, and the second chuck 102*b* is translucent or opaque, or the second chuck 102*b* is substantially transparent, and the first chuck 102*a* is translucent or opaque.

As further shown in FIG. 1, the first chuck 102*a* is configured to support a first wafer 104*a*, and the second chuck 102*b* is adapted to support a second wafer 104*b*. The first wafer 104*a* is also referred to herein as a "bottom wafer," and the second wafer 104*b* is also referred to herein as a "top wafer." Accordingly, the first chuck 102*a* is also referred to herein as a "bottom chuck," and the second chuck 102*b* is also referred to herein as a "top chuck."

As further shown in FIG. 1, the second chuck 102*b* may also include one or more vacuum holes for one or more conduits (shown as conduit 106*a* and conduit 106*b* in FIG. 1). For example, the conduit 106*a* and the conduit 106*b* may each include a metal, plastic, or another type of material configured to allow a corresponding pump at a proximal end of the conduit to remove air from a distal end of the conduit.

Accordingly, a pump corresponding to conduit 106*a* and a pump corresponding to conduit 106*b* may each generate a vacuum (e.g., in a range from approximately 200 millibars (mbar) to approximately 400 mbar) between the second chuck 102*b* and the second wafer 104*b*. As a result, the second wafer 104*b* remains adhered to the second chuck 102*b* during a bonding process for the first wafer 104*a* and the second wafer 104*b*. Although not shown in FIG. 1 for simplicity, the first chuck 102*a* may similarly include one or more vacuum holes for one or more conduits (e.g., as shown in FIG. 2).

As further shown in FIG. 1, the second chuck 102*b* includes an aperture formed therein that extends from one side to the other side of the second chuck 102*b*. The aperture may be disposed proximate a substantially central region of the second chuck 102*b*. The aperture is configured to accommodate a pin 108. The pin 108 may include a ceramic or another hard material (e.g., with a hardness of at least approximately 10 GPa).

During a bonding process for the first wafer 104*a* and the second wafer 104*b*, pressure is applied using the pin 108 to the second wafer 104*b*. As a result, the second wafer 104*b* is deformed (mechanically) toward the first wafer 104*a* until the first wafer 104*a* and the second wafer 104*b* are bonded. For example, the pressure applied using the pin 108 may be relieved when a pressure sensor, an optical sensor, a timer, and/or another type of sensor (e.g., as described in connection with FIGS. 6A-6D) detects that the first wafer 104*a* and the second wafer 104*b* are bonded.

The number and arrangement of components shown in FIG. 1 are provided as an example. The wafer bonding tool 100 may include additional components, fewer components, different components, or differently arranged components than those shown in FIG. 1. Additionally, or alternatively, a set of components (e.g., one or more components) of the wafer bonding tool 100 may perform one or more functions described as being performed by another set of components of the wafer bonding tool 100.

Figure 2A:
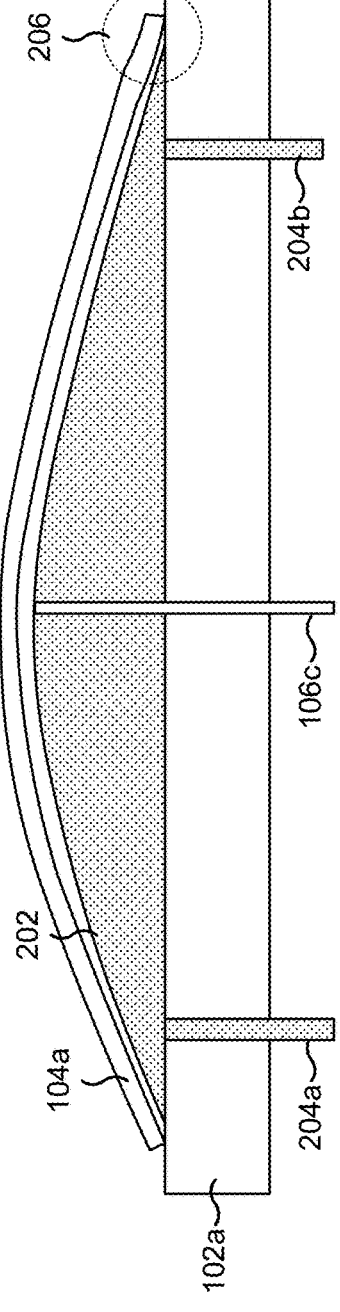
FIG. 2A is a diagram of an example bottom chuck for a wafer bonding tool described herein.

FIG. 2A is a diagram of an example bottom chuck for a wafer bonding tool 200 described herein. In particular, FIG. 2A illustrates a bottom chuck for deforming a bottom wafer toward a top wafer.

In order to reduce mechanical deformation of a second wafer 104*b*, the wafer bonding tool 200 includes a bag 202 configured to deform a first wafer 104*a* toward the second wafer 104*b* (not shown in FIG. 2A for simplicity). In some implementations, the bag 202 may be formed of a metal. For example, the bag 202 may be formed of a material with a thermal conductivity of at least approximately 150 W/mK.

As shown in FIG. 2A, a first chuck 102*a* may include one or more vacuum holes for one or more conduits (shown as conduit 106*c* in FIG. 2A). For example, the conduit 106*c* may include a metal, plastic, or another type of material configured to allow a corresponding pump at a proximal end of the conduit to remove air from a distal end of the conduit.

Accordingly, a pump corresponding to conduit 106*c* may generate a vacuum (e.g., in a range from approximately 200 mbar to approximately 400 mbar) between the first chuck 102*a* and the first wafer 104*a*. For example, as shown by reference number 206, a perimeter of the first wafer 104*a* may contact a surface of the first chuck 102*a*. Accordingly, the vacuum may be generated because the contact between the perimeter of the first wafer 104*a* and the first chuck 102*a* allows for less air to enter the volume between the first chuck 102*a* and the first wafer 104*a* than the conduit 106*c* removes. In another example, a perimeter of the first wafer 104*a* may contact a perimeter of the bag 202, which may be formed of a solid material, as described in connection with FIG. 5B. Accordingly, the vacuum may be generated because the contact between the perimeter of the first wafer 104*a* and the perimeter of the bag 202 allows for less air to enter the volume between the first chuck 102*a* and the first wafer 104*a* than the conduit 106*c* removes. As a result, the first wafer 104*a* remains adhered to the first chuck 102*a* during a bonding process for the first wafer 104*a* and the second wafer 104*b*.

As further shown in FIG. 2A, the first chuck 102*a* may include one or more filling holes for one or more conduits (shown as conduit 204*a* and conduit 204*b* in FIG. 2A). For example, the conduit 204*a* and the conduit 204*b* may each include a metal, plastic, or another type of material configured to allow a corresponding pump at a proximal end of the conduit to fill and empty the bag 202.

The conduits 204*a* and 204*b* may be used to fill the bag 202 with liquid. In some implementations, the conduit 204*a* and the conduit 204*b* may each be connectable to a corresponding port on the bag 202. For example, the conduit 204*a* and the conduit 204*b* may each screw onto, snap into, or otherwise connect to a corresponding port that was fused to the bag 202. Accordingly, the bag 202 is removable from the conduits 204*a* and 204*b*. Alternatively, the conduit 204*a* and the conduit 204*b* may each be fused to the bag 202. For example, the conduit 204*a* and the conduit 204*b* may be sewn, soldered, or otherwise fused to the bag 202. Accordingly, the bag 202 is integral with the conduits 204*a* and 204*b*.

As the bag 202 fills, the first wafer 104*a* is deformed toward the second wafer 104*b*. Liquids are less compressible and less susceptible to thermal changes than gases. As a result, by filling the bag 202 with liquid, run-out variation is reduced across wafer bonding processes, which conserves wasted wafers by increasing yield and reducing a quantity of non-functioning devices (e.g., devices that fail a WAT) that are produced.

In some implementations, the bag 202 is filled with liquid that has a coefficient of compressibility in a range from approximately $2 \cdot 10^{-9}$ inverse Pascals ($Pa^{-1}$) to approximately $7 \cdot 10^{-10}$ $Pa^{-1}$. By selecting a liquid with a coefficient of compressibility of at least $2 \cdot 10^{-9}$ $Pa^{-1}$, the run-out variation is decreased as compared with using a gas. By selecting a liquid with a coefficient of compressibility of no more than $7 \cdot 10^{-10}$ $Pa^{-1}$, efficiency is increased by avoiding use of highly dense liquids (e.g., mercury (Hg)) that would require more power to pump into and out of the bag 202. Additionally, or alternatively, the bag 202 is filled with liquid that has a specific heat capacity in a range from approximately 1.5 Joules per gram-degree Celsius (J/g(° C.)) to approximately 5 J/g(° C.). By selecting a liquid with a specific heat capacity of at least 1.5 J/g(° C.), the run-out variation is decreased as compared with using a gas. By selecting a liquid with a specific heat capacity of no more than 5 J/g(° C.), efficiency is increased by avoiding use of liquids that would require more power to pre-heat (e.g., as described in connection with FIG. 4B). Accordingly, in one example, the bag 202 is filled with hydraulic oil.

The number and arrangement of components shown in FIG. 2A are provided as an example. The wafer bonding tool 200 may include additional components, fewer components, different components, or differently arranged components than those shown in FIG. 2A. Additionally, or alternatively, a set of components (e.g., one or more components) of the wafer bonding tool 200 may perform one or more functions described as being performed by another set of components of the wafer bonding tool 200.

Figure 2B:
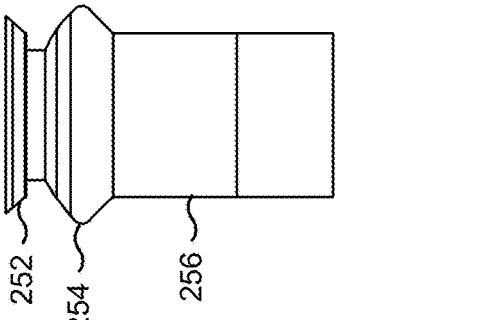
FIG. 2B is a diagram of an example vacuum conduit for a bottom chuck described herein.

FIG. 2B is a diagram of an example vacuum conduit 250 for a wafer bonding tool 200 described herein. For example, the conduit 250 may be used for a bottom chuck, as a described in connection with FIG. 2A, or for a top chuck, as described herein.

As shown in FIG. 2B, the conduit 250 may include a connector 252 configured to screw onto, snap into, or otherwise connect to a corresponding port. For example, the corresponding port may be fused to bag 202, as described in connection with FIG. 2A.

As further shown in FIG. 2B, the conduit 250 may further include a flexible portion 254 configured to allow a solid portion 256 to move laterally and/or vertically relative to the connector 252. For example, the flexible portion 254 may be formed of a thin, flexible metal, a flexible plastic, and/or another type of flexible material. The solid portion 256 may be formed of a thick, solid metal, a solid plastic, and/or another type of solid material.

As described above, FIG. 2B is provided as an example. Although described with respect to a conduit used for a vacuum (e.g., conduit 106, as described herein), example conduit 250 may similarly be used as a conduit for liquid (e.g., conduit 204, as described herein) for the bag 202.

Figure 3:
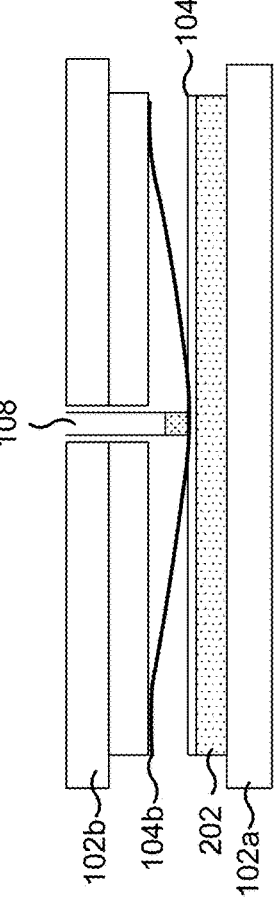
FIG. 3 is a diagram of an example wafer bonding tool described herein.

FIG. 3 is a diagram of an example wafer bonding tool 300 described herein. In particular, FIG. 3 uses a top chuck for deforming a top wafer toward a bottom wafer, as described in connection with FIG. 1, and a bottom chuck for deforming the bottom wafer toward the top wafer, as described in connection with FIG. 2A.

As shown in FIG. 3, during a bonding process for a first wafer 104a and a second wafer 104b, pressure is applied using a pin 108 to the second wafer 104b. As a result, the second wafer 104b is deformed (mechanically) toward the first wafer 104a.

Additionally, during the bonding process for a first wafer 104a and a second wafer 104b, the bag 202 is filled with liquid. As the bag 202 fills, the first wafer 104a is deformed (mechanically) toward the second wafer 104b.

The pin 108 may apply pressure and the bag 202 may fill until the first wafer 104a and the second wafer 104b are bonded. For example, the pressure applied using the pin 108 may be relieved and the bag 202 may be emptied when a pressure sensor, an optical sensor, a timer, and/or another type of sensor (e.g., as described in connection with FIGS. 6A-6D) detects that the first wafer 104a and the second wafer 104b are bonded.

By using the wafer bonding tool 300 described in connection with FIG. 3, the bag 202 is filled with liquid to deform the bottom wafer 104a. Generally, liquids are less susceptible to temperature changes than gases, which reduces run-out variation across wafer bonding processes. Reducing run-out variation conserves wasted wafers by increasing yield and reducing a quantity of non-functioning devices (e.g., devices that fail a WAT) that are produced.

The number and arrangement of components shown in FIG. 3 are provided as an example. The wafer bonding tool 300 may include additional components, fewer components, different components, or differently arranged components than those shown in FIG. 3. Additionally, or alternatively, a set of components (e.g., one or more components) of the wafer bonding tool 300 may perform one or more functions described as being performed by another set of components of the wafer bonding tool 300.

Figure 4:
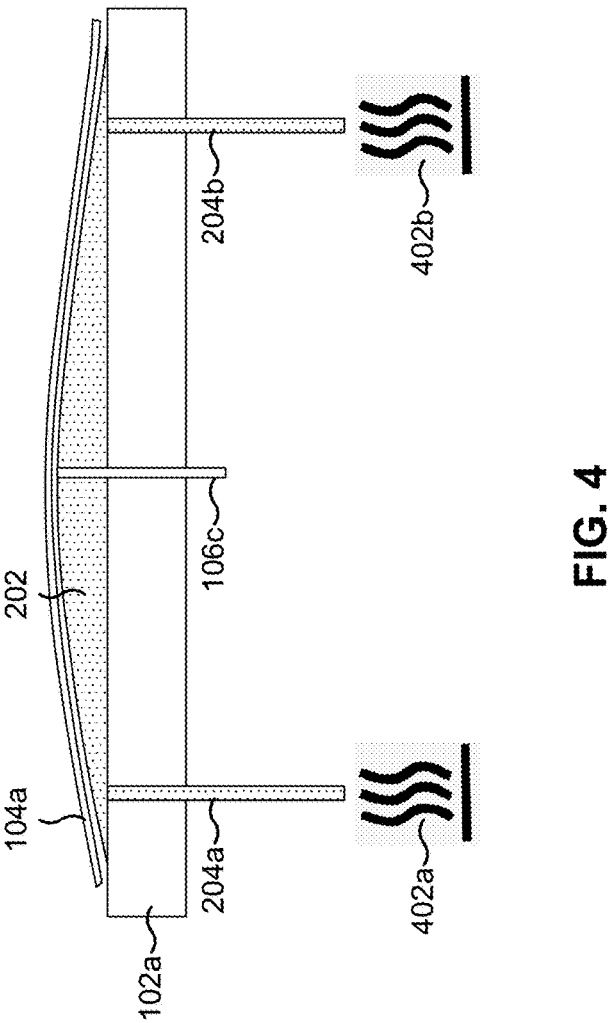
FIG. 4 is a diagram of an example implementation described herein.

FIG. 4 is a diagram of an example bottom chuck for a wafer bonding tool 400 described herein. In particular, FIG. 4 illustrates a bottom chuck for deforming a bottom wafer toward a top wafer.

In order to reduce mechanical deformation of the first wafer 104a, the wafer bonding tool 400 includes one or more heaters (shown as heater 402a and heater 402b in FIG. 4) configured to pre-heat a liquid used to fill bag 202. For example, the heaters 402a and 402b may each include electric coils, a thermal exchanger proximate to a gas burner, and/or another type of heating element configured to heat liquid passing through the heaters 402a and 402b. Alternatively, the heaters 402a and 402b may be configured to heat liquid stored in a tank or other storage mechanism such that the liquid is heated when pumped into the bag 202 from the tank. In some implementations, the heater 402a and the heater 402b may be connected to the conduit 204a and the conduit 204b, respectively, before a corresponding pump or after a corresponding pump. Alternatively, the heater 402a and the heater 402b may each be integrated with a corresponding pump.

Accordingly, as shown in FIG. 4, some mechanical deformation of the first wafer 104a is replaced by thermal deformation due to heat exchange between the liquid and the first wafer 104a. In some implementations, as described herein, the bag 202 is formed of metal so as to increase the heat flow from the liquid to the first wafer 104a. Furthermore, a second wafer 104b (not shown in FIG. 4 for simplicity) may receive some heat from the liquid via the first wafer 104a such that some mechanical deformation of the second wafer 104b is replaced by thermal deformation.

In some implementations, the heater 402a and the heater 402b may pre-heat the liquid to a range from approximately 45° C. to approximately 100° C. By selecting at least 45° C., the mechanical deformation of the first wafer 104a is substantially decreased due to heat exchange from the liquid to the first wafer 104a. By selecting no more than 100° C., the liquid may be selected to be water without boiling the water, which would cause more instability during deformation of the first wafer 104a.

By using the heaters 402a and 402b described in connection with FIG. 4, the bottom wafer 104a (and, to some extent, the top wafer 104b) experiences some thermal deformation and less mechanical deformation, which further increases yield and reduces a quantity of non-functioning devices that are produced.

The number and arrangement of components shown in FIG. 4 are provided as an example. The wafer bonding tool 400 may include additional components, fewer components, different components, or differently arranged components than those shown in FIG. 4. Additionally, or alternatively, a set of components (e.g., one or more components) of the wafer bonding tool 400 may perform one or more functions described as being performed by another set of components of the wafer bonding tool 400.

Figure 5A:
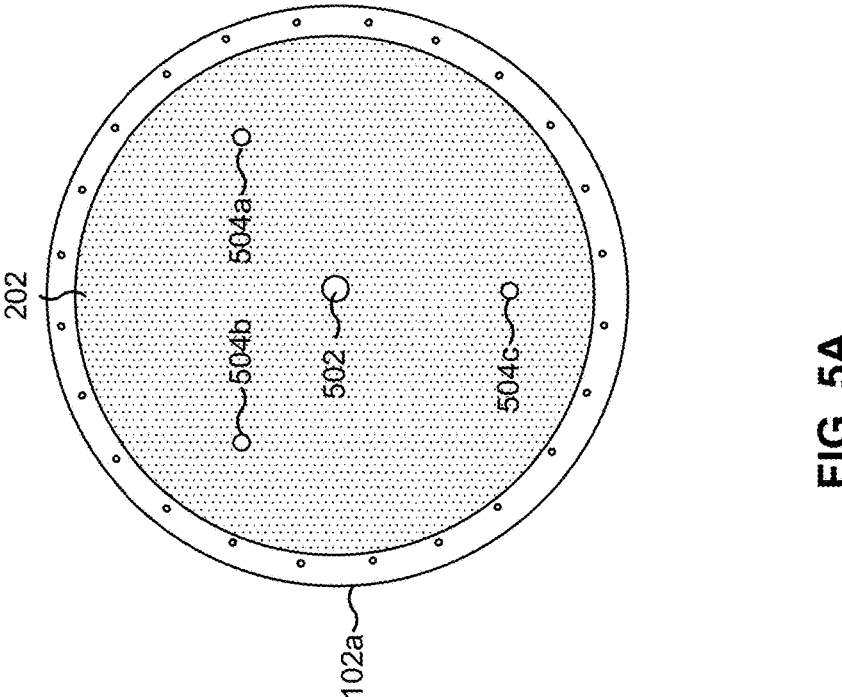
FIG. 5A is a diagram of a top view of an example bottom chuck for a wafer bonding tool described herein.

FIG. 5A is a diagram of an example bottom chuck for a wafer bonding tool 500 described herein. In particular, FIG. 5A illustrates a bottom chuck for deforming a bottom wafer toward a top wafer.

As shown in FIG. 5A, a bottom chuck 102*a* supports a bag 202. The bag 202 has an outer circumference and at least one first inner circumference (shown as first inner circumference 502 in FIG. 5A). For example, the first inner circumference 502 may allow a conduit for a vacuum (e.g., conduit 106 as described herein) to pass through the first inner circumference 502. Additionally, the bag 202 has at least one second inner circumference (shown as second inner circumference 504*a*, second inner circumference 504*b*, and second inner circumference 504*c* in FIG. 5A). For example, the second inner circumferences 504*a*, 504*b*, and 504*c* may each allow a loading pin for a first wafer 104*a* (not shown in FIG. 5A for simplicity) to pass through the second inner circumference 504*a*, 504*b*, and 504*c*, respectively. For example, each loading pin may include a ceramic or another hard material (e.g., with a hardness of at least approximately 10 GPa). Accordingly, the loading pins help support the first wafer 104*a* before the bag 202 is inflated and after the bag 202 is deflated.

In order to form the inner circumferences, the bag 202 may be formed of at least one top sheet (e.g., of metal) patterned with the inner circumferences and at least one bottom sheet (e.g., of the same metal) patterned with the inner circumferences. Accordingly, the inner circumferences may be seams where the top sheet(s) and the bottom sheet(s) were fastened together (e.g., by sewing, by soldering, or by another type of fusing). Alternatively, the inner circumferences may be formed during extrusion of a metal or other material for the bag 202 such that the bag 202 is a single piece of extruded metal with multiple inner circumferences.

The number and arrangement of components shown in FIG. 5A are provided as an example. The wafer bonding tool 500 may include additional components, fewer components, different components, or differently arranged components than those shown in FIG. 5A. Additionally, or alternatively, a set of components (e.g., one or more components) of the wafer bonding tool 500 may perform one or more functions described as being performed by another set of components of the wafer bonding tool 500.

Figure 5B:
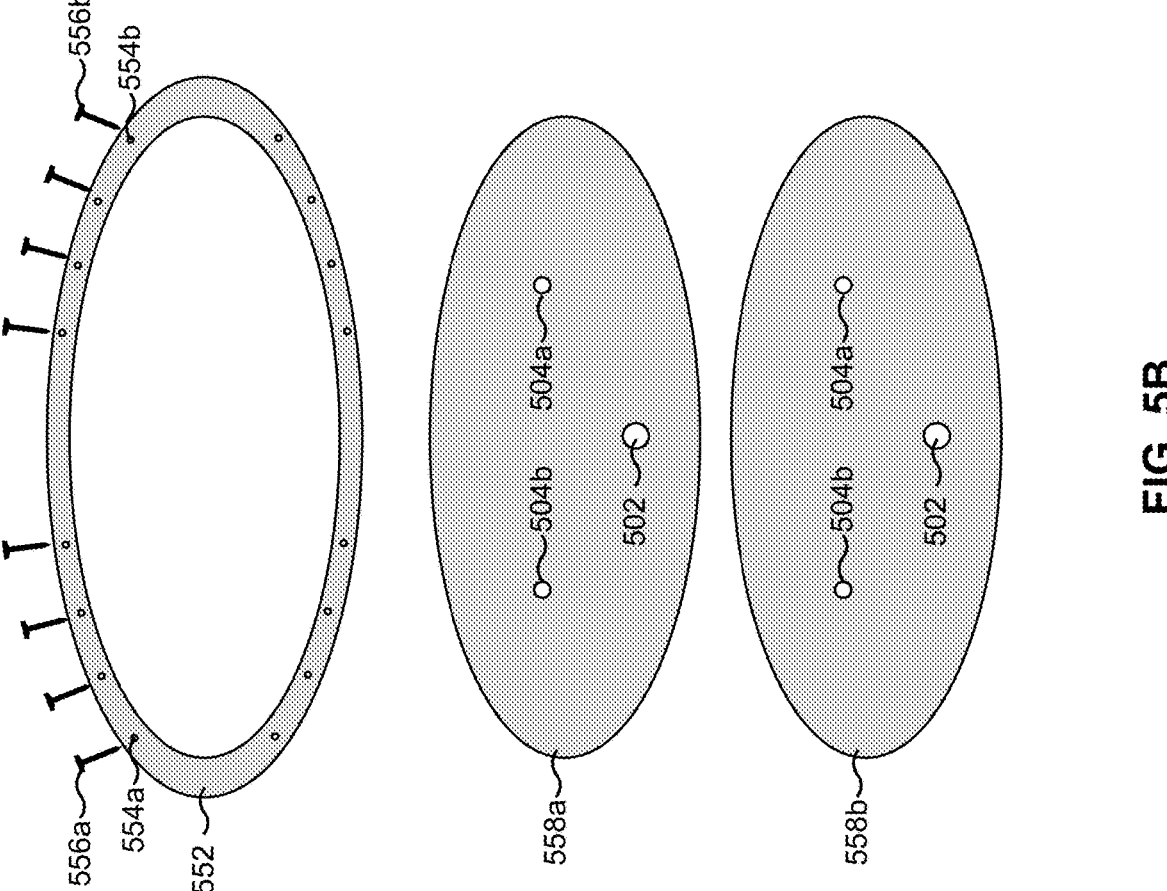
FIG. 5B is a diagram of components of a bag for a wafer bonding tool described herein.

FIG. 5B is a diagram of an example 550 of a bag 202 for a wafer bonding tool described herein. For example, the bag 202 may be used in wafer bonding, as described in connection with FIGS. 6A-6D.

As shown in FIG. 5B, a perimeter component 552 may be formed of solid metal, solid plastic, and/or another hard material providing reinforcement for an outer circumference of the bag 202. Additionally, the perimeter component 552 may include one or more holes (e.g., hole 554*a*, hole 554*b*, and so on). The hole(s) may be formed integrally with the perimeter component 552 (e.g., during casting of the metal, plastic, and/or other material of the perimeter component 552). Alternatively, the hole(s) may be formed after casting of the metal, plastic, and/or other material of the perimeter component 552 (e.g., via drilling).

Connectors 556*a*, 556*b*, and so on may correspond to the holes 554*a*, 554*b*, and so on. For example, the connectors 556*a* and 556*b* may include screws, bolts and nuts, nails, and/or other components configured to fill the holes 554*a* and 554*b*. Additionally, the connectors 556*a* and 556*b* may bind an upper sheet 558*a* and a lower sheet 558*b* together, as described below.

Accordingly, as further shown in FIG. 5B, the upper sheet 558*a* and the lower sheet 558*b* may be formed of thin metal and/or another similar flexible material. The upper sheet 558*a* and the lower sheet 558*b* may include inner circumferences, as described in connection with FIG. 5A (e.g., hole 502, hole 504*a*, and hole 504*b* in example 550).

Therefore, the connectors 556*a* and 556*b* may bind the upper sheet 558*a* and the lower sheet 558*b* together along the outer circumferences. In some implementations, the connectors 556*a* and 556*b* may pass through the upper sheet 558*a* and the lower sheet 558*b* near the outer circumferences. Accordingly, the connectors 556*a* and 556*b* may apply force directly to the upper sheet 558*a* and the lower sheet 558*b* to bind them together. Alternatively, the connectors 556*a* and 556*b* may pass only through holes 554*a* and 554*b* and not through the upper sheet 558*a* and the lower sheet 558*b*. Accordingly, the connectors 556*a* and 556*b* may apply force indirectly to the upper sheet 558*a* and the lower sheet 558*b* through the perimeter component 552 to bind the upper sheet 558*a* and the lower sheet 558*b* together.

As described above, FIG. 5B is provided as an example. Although described as formed of separate components, one or more of the components described in connection with FIG. 5B may be formed integrally.

Figure 5C:
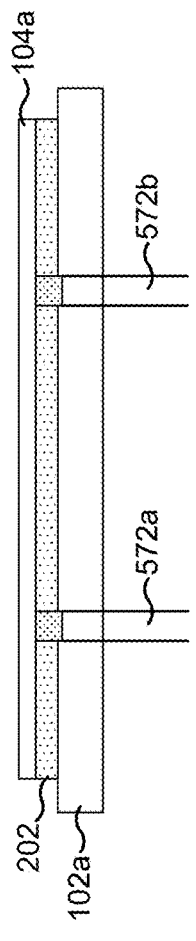
FIGS. 5C-5D are diagrams of loading pins for a wafer bonding tool described herein.
Figure 5D:
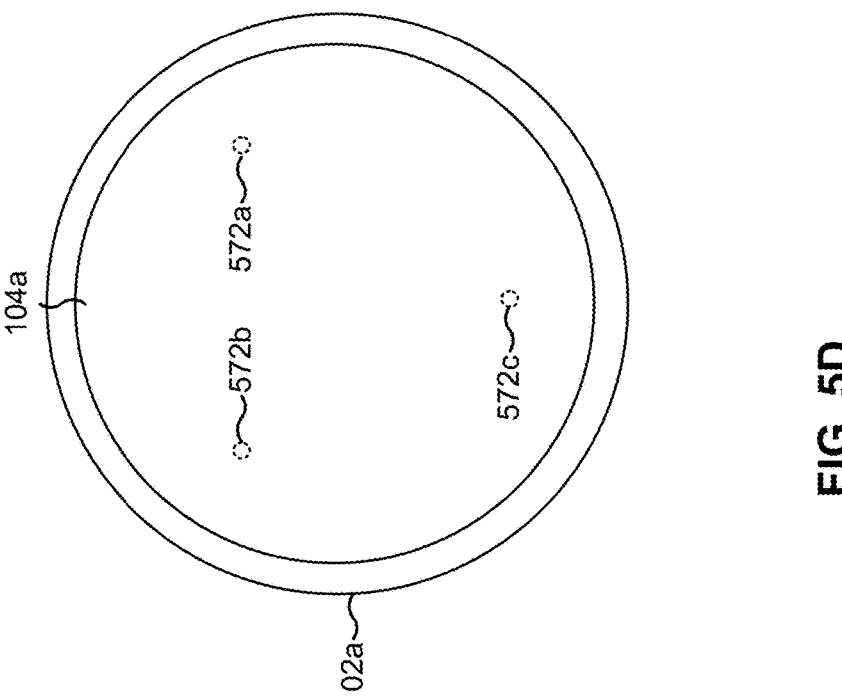

FIGS. 5C-5D are a diagram of an example 570 of loading pins 572 for a wafer bonding tool described herein. For example, the loading pins 572 may support a first wafer 104*a* during bonding, as described in connection with FIGS. 6A-6D.

As shown in FIG. 5C, one or more loading pins (e.g., loading pin 572*a* and loading pin 572*b*) may pass through a chuck 102*a* and a bag 202 to support the first wafer 104*a* before the bag 202 is inflated with liquid. The loading pins 572*a* and 572*b* may each include a ceramic or another hard material (e.g., with a hardness of at least approximately 10 GPa).

FIG. 5D shows a top-down view of the first wafer 104*a* over the chuck 102*a* and supported by loading pins 572*a*, 572*b*, and 572*c*. Accordingly, top surfaces of the loading pins 572*a*, 572*b*, and 572*c* contact a lower surface of the first wafer 104*a* to support the first wafer 104*a* before the bag 202 is inflated with liquid.

As described above, FIGS. 5C-5D are provided as an example. For example, additional loading pins (e.g., four pins, five pins, and so on) may be used.

FIGS. 6A-6D are diagrams of an example implementation 600 associated with using a semiconductor processing tool described herein (e.g., a wafer bonding tool). Example implementation 600 includes a bottom chuck 102*a* supporting a first wafer 104*a*, a top chuck 102*b* supporting a second wafer 104*b*, conduits 106*a* and 106*b* configured to generate a vacuum between the top chuck 102*b* and the second wafer 104*b*, conduits 106*c* and 106*d* configured to generate a vacuum between the bottom chuck 102*a* and the first wafer 104*a*, a pin 108 configured to apply pressure to the second wafer 104*b*, and a conduit 204 configured to fill and empty a bag 202. These components are described in more detail in connection with FIGS. 1-4. Example implementation 600 further includes a controller 602. The controller is described in more detail in connection with FIG. 8.

Figure 6A:
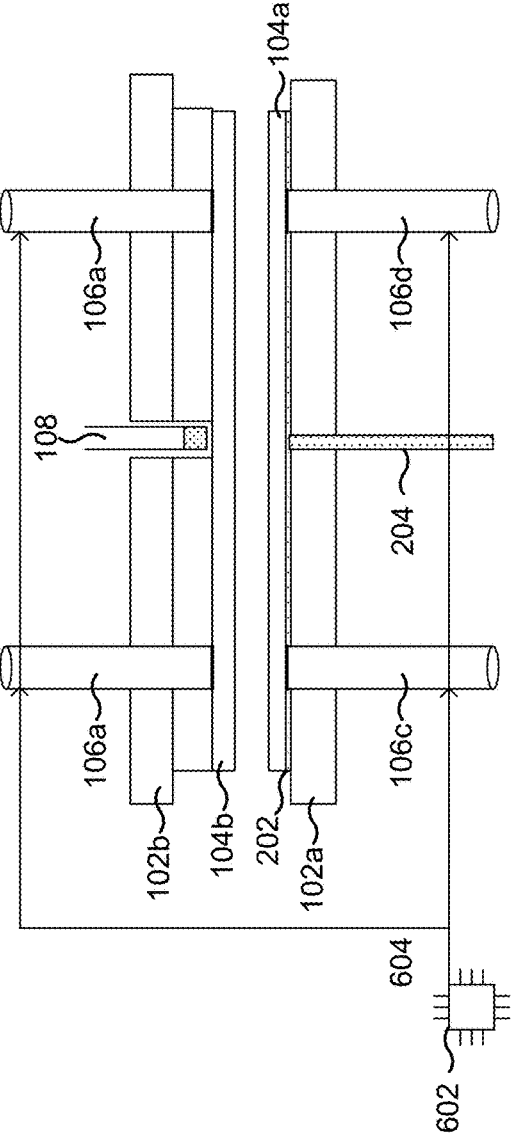
FIGS. 6A-6D are diagrams of an example implementation described herein.

As shown in FIG. 6A and by reference number 604, the controller 602 may transmit a command (e.g., to pumps corresponding to conduits 106*a*, 106*b*, 106*c*, and 106*d*) to generate a vacuum between the top chuck 102*b* and the second wafer 104b and a vacuum between the bottom chuck 102a and the first wafer 104a. For example, the controller 602 may receive input indicative of a start of a wafer bonding process for the first wafer 104a and the second wafer 104b and may transmit the command based on the input. Alternatively, the controller 602 may receive one or more signals, indicating that the first wafer 104a and the second wafer 104b are loaded onto the bottom chuck 102a and the top chuck 102b, respectively, from a device (e.g., a robotic arm) configured to load the bottom chuck 102a and the top chuck 102b. Accordingly, the controller 602 may transmit the command based on the one or more signals.

Figure 6B:
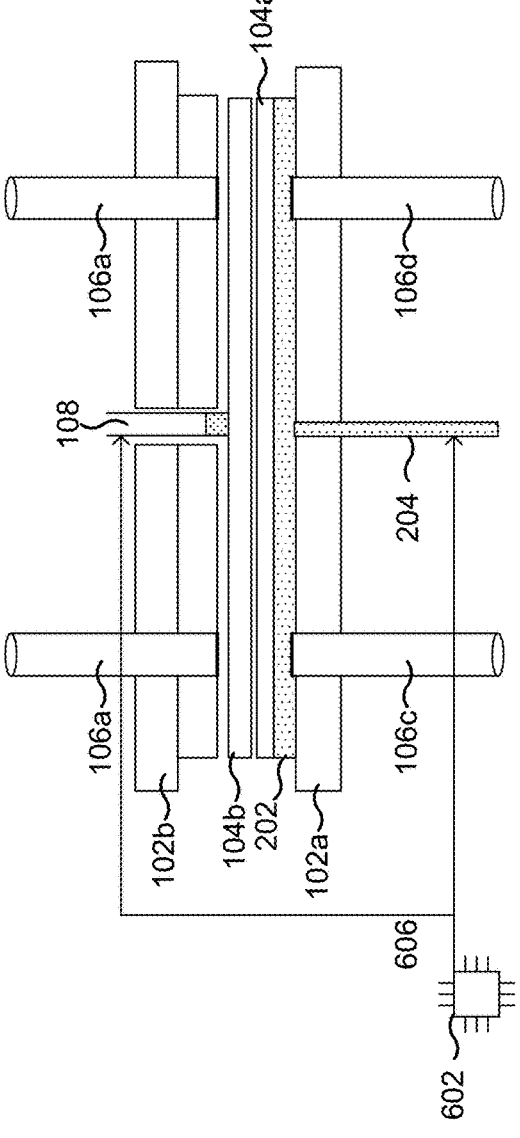

As shown in FIG. 6B and by reference number 606, the controller 602 may transmit a command (e.g., to a motor associated with the pin 108) to deform the second wafer 104b toward the first wafer 104a and may transmit a command (e.g., to a pump corresponding to conduit 204) to fill the bag 202 with liquid (in order to deform the first wafer 104a toward the second wafer 104b). For example, the controller 602 may receive input indicative of a start of the wafer bonding process for the first wafer 104a and the second wafer 104b and may transmit the command based on the input. Additionally, or alternatively, the controller 602 may detect expiry of a timer started when the controller 602 transmitted the command to generate the vacuums and may transmit the command to deform the wafers based on the expiry.

Alternatively, the controller 602 may receive one or more signals, indicating that the first wafer 104a and the second wafer 104b are adhered to the bottom chuck 102a and the top chuck 102b, respectively, from the pumps corresponding to conduits 106a, 106b, 106c, and 106d. Additionally, or alternatively, the controller 602 may receive one or more signals, indicating that the first wafer 104a and the second wafer 104b are adhered the bottom chuck 102a and the top chuck 102b, respectively, from one or more sensors configured to detect that the vacuum between the top chuck 102b and the second wafer 104b and the vacuum between the bottom chuck 102a and the first wafer 104a satisfy a vacuum threshold. Accordingly, the controller 602 may transmit the command based on the one or more signals.

Figure 6C:
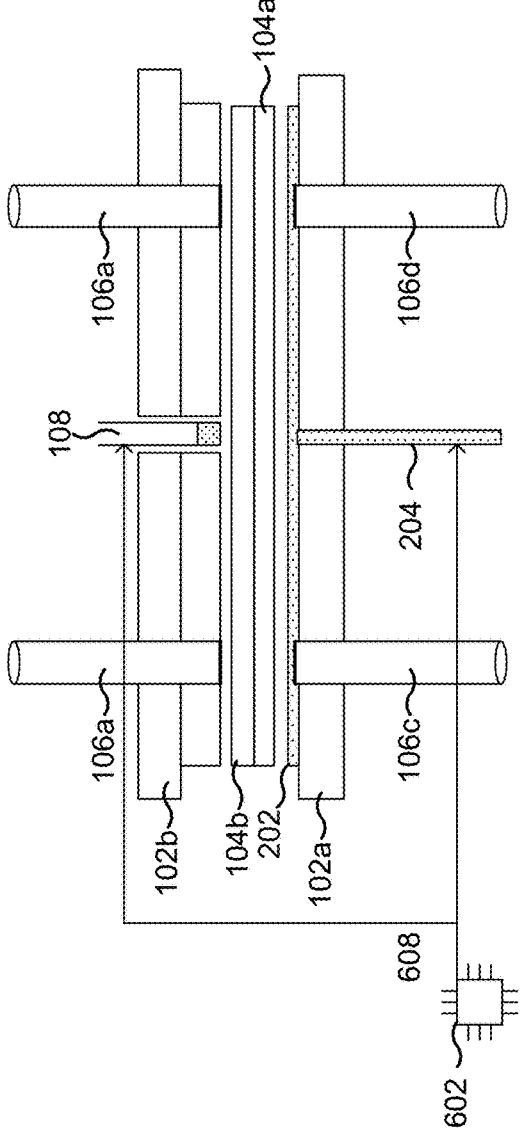

As shown in FIG. 6C and by reference number 608, the controller 602 may transmit a command (e.g., to the motor associated with the pin 108) to relieve pressure applied by the pin 108 (in order to refrain from deforming the second wafer 104b toward the first wafer 104a) and may transmit a command (e.g., to the pump corresponding to conduit 204) to remove the liquid from the bag 202 (in order to refrain from deforming the first wafer 104a toward the second wafer 104b). For example, the controller 602 may receive input indicative of an end of the wafer bonding process for the first wafer 104a and the second wafer 104b and may transmit the command based on the input. Additionally, or alternatively, the controller 602 may detect expiry of a timer started when the controller 602 transmitted the command to deform the wafers and may transmit the command to refrain from deforming the wafers based on the expiry.

Alternatively, the controller 602 may receive one or more signals, indicating that the first wafer 104a and the second wafer 104b are bonded together (e.g., from an optical sensor configured to detect when a space between the first wafer 104a and the second wafer 104b does not satisfy a visibility threshold and/or from a pressure sensor configured to detect when a pressure between the first wafer 104a and the second wafer 104b satisfies a pressure threshold, among other examples). Accordingly, the controller 602 may transmit the command based on the one or more signals.

Figure 6D:
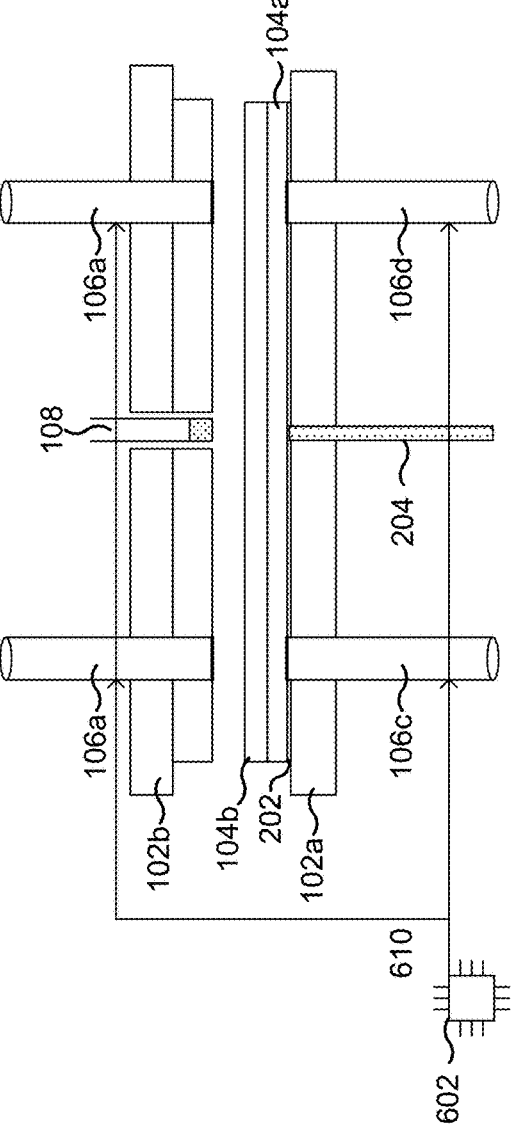

As shown in FIG. 6D and by reference number 610, the controller 602 may transmit a command (e.g., to the pumps corresponding to conduits 106a, 106b, 106c, and 106d) to refrain from generating the vacuum between the top chuck 102b and the second wafer 104b and/or the vacuum between the bottom chuck 102a and the first wafer 104a. For example, the controller 602 may receive input indicative of an end of the wafer bonding process for the first wafer 104a and the second wafer 104b and may transmit the command based on the input. Additionally, or alternatively, the controller 602 may detect expiry of a timer started when the controller 602 transmitted the command to refrain from the wafers and may transmit the command to refrain from generating the vacuum based on the expiry.

Alternatively, the controller 602 may receive one or more signals, indicating that the first wafer 104a and the second wafer 104b are bonded together (e.g., from an optical sensor configured to detect when a space between the first wafer 104a and the second wafer 104b does not satisfy a visibility threshold and/or from a pressure sensor configured to detect when a pressure between the first wafer 104a and the second wafer 104b satisfies a pressure threshold, among other examples). Accordingly, the controller 602 may transmit the command based on the one or more signals.

In some implementations, the controller 602 may determine one or more values to use for one or more timers between the commands described above based on a machine learning model. For example, the model may accept inputs based on the plurality of test wafer bonding processes and output one or more timer values to use.

In some implementations, the controller 602 is configured to use a machine learning model, which is trained based on historical data, to generate the commands described above. For example, the machine learning model may correlate historical changes in measurements associated with the first wafer 104a and the second wafer 104b with parameters associated with the pumps and/or the motor described above. Examples of historical parameters include model information associated with the pumps and/or the motor, operating voltages or pressures associated with the pumps and/or the motor, and/or movement ranges or flows associated with the pumps and/or the motor, among other examples. For a combination of changes and/or parameters, the machine-learning model may have been trained to estimate commands to the pumps and/or the motor to advance the wafer bonding process for the first wafer 104a and the second wafer 104b. Accordingly, the machine-learning modem may accept measurements associated with the first wafer 104a and the second wafer 104b as input and output the commands to provide to the pumps and/or the motor.

By using a process as described in connection with FIGS. 6A-6D, the bag 202 is filled with liquid to deform the bottom wafer 104a. Generally, liquids are less susceptible to temperature changes than gases, which reduces run-out variation across wafer bonding processes. Reducing run-out variation conserves wasted wafers by increasing yield and reducing a quantity of non-functioning devices (e.g., devices that fail a WAT) that are produced. In some implementations, the liquid used to fill the bag 202 may be pre-heated, as described in connection with FIG. 4, in order to reduce mechanical deformation during the wafer bonding process. Reducing mechanical deformation conserves wasted wafers by reducing chances of cracking or other defects during the wafer bonding process.

The number and arrangement of components shown in FIGS. 6A-6D are provided as an example. The implementation may include additional components, fewer components, different components, or differently arranged components than those shown in FIGS. 6A-6D. Additionally, or alternatively, a set of components (e.g., one or more components) of FIGS. 6A-6D may perform one or more functions described as being performed by another set of components of FIGS. 6A-6D.

Figure 7:
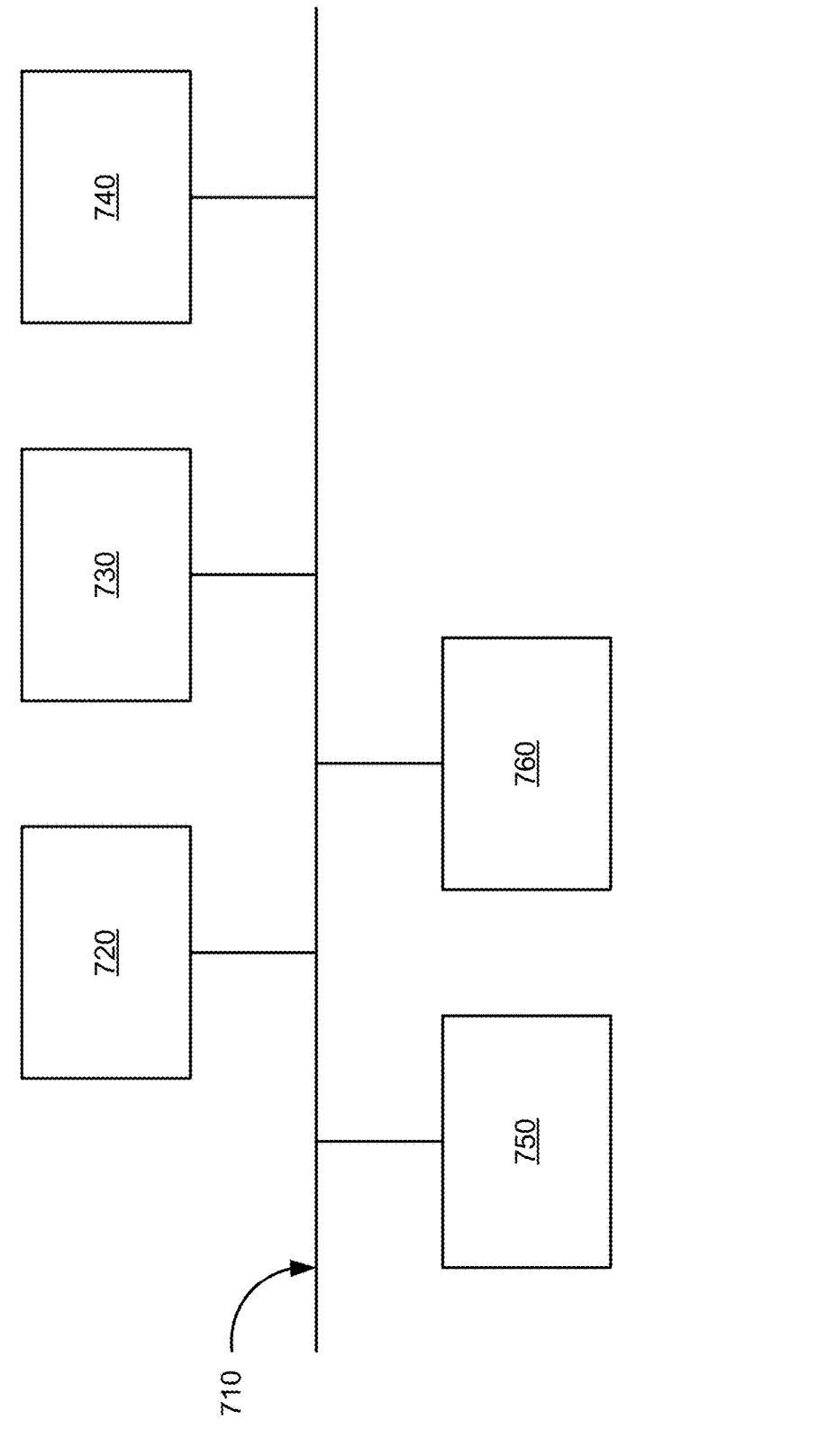
FIG. 7 is a diagram of example components of one or more devices of FIGS. 6A-6D described herein.

FIG. 7 is a diagram of example components of a device 700, which may correspond to a controller (e.g., controller 602), one or more pumps (e.g., associated with conduit(s) 106 and/or conduit(s) 204), one or more heaters 402, and/or a movement mechanism (e.g., associated with pin 108). In some implementations, a controller, one or more pumps, one or more heaters, and/or a movement mechanism include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
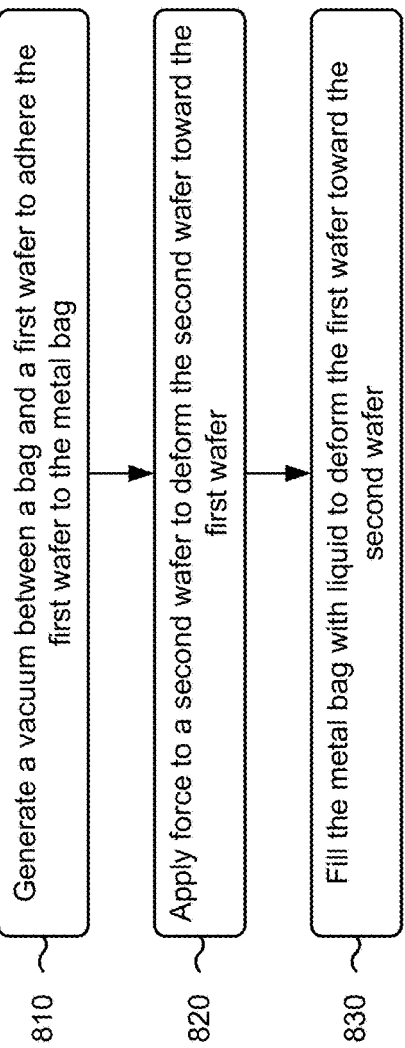
FIG. 8 is a flowchart of an example process associated with using a wafer bonding tool described herein.

FIG. 8 is a flowchart of an example process 800 associated with using a wafer bonding tool. In some implementations, one or more process blocks of FIG. 8 are performed by a semiconductor processing tool (e.g., wafer bonding tool 300). In some implementations, one or more process blocks of FIG. 8 are performed by another device or a group of devices separate from or including the device, such as a controller (e.g., controller 602), one or more pumps (e.g., associated with conduit(s) 106 and/or conduit(s) 204), one or more heaters 402, and/or a movement mechanism (e.g., associated with pin 108). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include generating a vacuum between a bag and a first wafer to adhere the first wafer to the bag (block 810). For example, the wafer bonding tool 300 may generate a vacuum between a bag 202 and a first wafer 104a to adhere the first wafer 104a to the bag 202, as described herein.

As further shown in FIG. 8, process 800 may include applying force to a second wafer to deform the second wafer toward the first wafer (block 820). For example, the wafer bonding tool 300 may apply force to a second wafer 104b to deform the second wafer 104b toward the first wafer 104a, as described herein.

As further shown in FIG. 8, process 800 may include filling the bag with liquid to deform the first wafer toward the second wafer (block 830). For example, the wafer bonding tool 300 may fill the bag 202 with liquid to deform the first wafer 104a toward the second wafer 104b, as described above.

Process 800 may include additional implementations, such as any single implementation or any combination of implementations described below and/or in connection with one or more other processes described elsewhere herein.

In a first implementation, the wafer bonding tool 300 fills the bag 202 with liquid that has a coefficient of compressibility in a range from approximately $2 \cdot 10^{-9}$ Pa$^{-1}$ to approximately $7 \cdot 10^{-10}$ Pa$^{-1}$.

In a second implementation, alone or in combination with the first implementation, the wafer bonding tool 300 fills the bag 202 with liquid that has a specific heat capacity in a range from approximately 1.5 J/g(° C.) to approximately 5 J/g(° C.).

In a third implementation, alone or in combination with one or more of the first and second implementations, process 800 further includes heating (e.g., using heater(s) 402) the liquid to at least 45° Celsius and filling the bag 202 with the pre-heated liquid.

In a fourth implementation, alone or in combination with one or more of the first through third implementations, process 800 further includes determining (e.g., using controller 602) that the first wafer 104*a* is bonded to the second wafer 104*b*, and removing the liquid from the bag 202 based on determining that the first wafer 104*a* is bonded to the second wafer 104*b*.

In a fifth implementation, alone or in combination with one or more of the first through fourth implementations, process 800 further includes determining (e.g., using controller 602) that the first wafer 104*a* is bonded to the second wafer 104*b*, and refraining from applying force to the second wafer 104*b* (e.g., using pin 108) based on determining that the first wafer 104*a* is bonded to the second wafer 104*b*.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

In this way, a bag is filled with liquid, instead of an airbag filled with gas, to deform a bottom wafer toward a top wafer during a wafer bonding process. As a result, the liquid is less susceptible to temperature changes, which reduces run-out variation across wafer bonding processes. Reducing run-out variation conserves wasted wafers by increasing yield and reducing a quantity of non-functioning devices that are produced. Increasing yield, in turn, conserves power, processing resources, and raw materials. Additionally, in some implementations, the liquid may be pre-heated before the bag is filled with the liquid. As a result, the bottom wafer (and, to some extent, the top wafer) experiences some thermal deformation and less mechanical deformation, which further increases yield and reduces a quantity of non-functioning devices that are produced.

As described in greater detail above, some implementations described herein provide a device. The device includes a bag configured to adhere to a chuck base on a bottom side and configured to support a wafer on a top side. The bag includes an inner volume that expands when filled with liquid, and expansion of the bag deforms the wafer on the top side. The bag has an outer circumference, at least one first inner circumference surrounding a vacuum pipe, and at least one second inner circumference surrounding a loading pin.

As described in greater detail above, some implementations described herein provide a method. The method includes generating a vacuum between a bag and a first wafer to adhere the first wafer to the bag. The method further includes applying force to a second wafer to deform the second wafer toward the first wafer. The method includes filling the bag with liquid to deform the first wafer toward the second wafer.

As described in greater detail above, some implementations described herein provide a system. The system includes a top chuck configured to support a first wafer. The system further includes a pin configured to deform the first wafer toward a second wafer. The system includes a bottom chuck configured to support the second wafer. The system further includes a bag filled with liquid configured to deform the second wafer toward the first wafer. The system includes a pipe configured to generate a vacuum between the second wafer and the bag, the pipe passing through a hole in the bag.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a bag configured to adhere to a chuck base on a bottom side and configured to support a wafer on a top side,
    wherein, when filled with a liquid, an inner volume of the bag expands and causes deformation of the wafer on the top side, and
    wherein the bag has an outer circumference, at least one first inner circumference surrounding a first conduit extending through an entirety of the bag, and at least one second inner circumference surrounding a loading pin, wherein the first conduit is configured to remove air between the bag and the wafer.

2. The device of claim 1,
wherein the bag is adapted to be filled with a hydraulic oil.

3. The device of claim 1,
wherein the at least one first inner circumference comprises at least one first seam, and the at least one second inner circumference comprises at least one second seam.

4. The device of claim 1,
wherein the bag comprises a single piece of extruded metal.

5. The device of claim 1, further comprising:
at least one port that is connectable to at least one second conduit configured to provide the liquid to fill the bag.

6. The device of claim 1,
wherein the bag further includes at least one opening that is fused to at least one second conduit configured to provide the liquid to fill the bag.

7. A method, comprising:
generating, via a conduit, a vacuum between a bag and a first wafer to remove air to adhere the first wafer to the bag, wherein the first conduit extends through an entirety of the bag;
applying, after generating the vacuum, a force to a second wafer to deform the second wafer toward the first wafer; and
filling, after applying the force, the bag with a liquid to deform the first wafer toward the second wafer.

8. The method of claim 7,
wherein filling the bag with the liquid comprises:
    filling the bag with the liquid that has a coefficient of compressibility in a range from approximately $2{\cdot}10^{-9}$ Pa$^{-1}$ to approximately $7{\cdot}10^{-10}$ Pa$^{-1}$.

9. The method of claim 7,
wherein filling the bag with the liquid comprises:

filling the bag with the liquid that has a specific heat capacity in a range from approximately 1.5 J/g(° C.) to approximately 5 J/g(° C.).

10. The method of claim 7, wherein filling the bag with the liquid comprises:

pre-heating the liquid to at least 45° Celsius; and filling the bag with the pre-heated liquid.

11. The method of claim 7, further comprising:

determining that the first wafer is bonded to the second wafer; and removing the liquid from the bag based on determining that the first wafer is bonded to the second wafer.

12. The method of claim 11, further comprising:

refraining from applying the force to the second wafer based on determining that the first wafer is bonded to the second wafer.

13. A system, comprising:

a top chuck configured to support a first wafer;

a pin configured to deform the first wafer toward a second wafer;

a bottom chuck configured to support the second wafer;

a bag filled with a liquid configured to deform the second wafer toward the first wafer while a perimeter of the bag remains in contact with a perimeter of the bottom chuck; and a pipe configured to generate a vacuum, between the second wafer and the bag, to remove air, wherein the pipe passes through an entirety of the bag.

14. The system of claim 13, further comprising:

at least one conduit configured to provide the liquid to fill the bag.

15. The system of claim 14, wherein the at least one conduit is further configured to remove the liquid from the bag after the first wafer and the second wafer are bonded.

16. The system of claim 13, further comprising:

a heater configured to pre-heat the liquid used to fill the bag.

17. The system of claim 13, further comprising:

a controller configured to transmit a command to generate the vacuum before the bag is filled with the liquid.

18. The system of claim 17, wherein the controller is further configured to transmit a command to fill the bag with the liquid.

19. The system of claim 13, further comprising:

a controller configured to determine that the first wafer and the second wafer are bonded and to transmit a command to remove the liquid from the bag.

20. The system of claim 19, wherein the controller is further configured to transmit a command to refrain from generating the vacuum.

* * * * *